US006998919B2

(12) United States Patent
Gamero et al.

(10) Patent No.: US 6,998,919 B2
(45) Date of Patent: Feb. 14, 2006

(54) TEMPERATURE COMPENSATED POWER AMPLIFIER POWER CONTROL

(75) Inventors: Carlos Gamero, High Point, NC (US); Ryan Bosley, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 66 days.

(21) Appl. No.: 10/692,075

(22) Filed: Oct. 22, 2003

(65) Prior Publication Data

US 2005/0088237 A1    Apr. 28, 2005

(51) Int. Cl.
    *H03G 3/20*        (2006.01)
(52) U.S. Cl. ...................................... 330/289; 330/285
(58) Field of Classification Search ................ 330/136, 330/285, 289, 297; 323/313
    See application file for complete search history.

(56) References Cited

U.S. PATENT DOCUMENTS

| 4,472,725 A | * | 9/1984 | Blumenkranz ............... 330/149 |
| 4,617,522 A | * | 10/1986 | Tarbutton et al. ........... 330/149 |
| 5,138,274 A | * | 8/1992 | Nakanishi et al. .......... 330/136 |
| 5,182,527 A | | 1/1993 | Nakanishi et al. .......... 330/285 |
| 5,442,322 A | | 8/1995 | Kornfeld et al. ............ 330/285 |
| 5,608,353 A | | 3/1997 | Pratt ........................... 330/295 |
| 5,629,648 A | | 5/1997 | Pratt ........................... 330/289 |
| 5,808,453 A | | 9/1998 | Lee et al. ..................... 323/224 |
| 5,870,296 A | | 2/1999 | Schaffer ........................ 363/65 |
| 5,977,833 A | | 11/1999 | Attimont et al. ............ 330/297 |
| 6,130,579 A | | 10/2000 | Iyer et al. .................... 330/285 |
| 6,137,274 A | | 10/2000 | Rajagopalan ................ 323/272 |
| 6,191,656 B1 | | 2/2001 | Nadler ........................ 330/288 |
| 6,229,395 B1 | | 5/2001 | Kay ............................. 330/252 |
| 6,265,943 B1 | | 7/2001 | Dening et al. ............... 330/296 |
| 6,271,727 B1 | | 8/2001 | Schmukler ................... 330/284 |
| 6,285,239 B1 | | 9/2001 | Iyer et al. ..................... 327/531 |
| 6,307,364 B1 | | 10/2001 | Augustine .................... 324/95 |
| 6,313,705 B1 | | 11/2001 | Dening et al. ............... 330/276 |
| 6,329,809 B1 | | 12/2001 | Dening et al. ................ 324/95 |
| 6,333,677 B1 | | 12/2001 | Dening ........................ 330/296 |
| 6,356,150 B1 | | 3/2002 | Spears et al. ................ 330/145 |
| 6,369,656 B1 | | 4/2002 | Dening et al. ............... 330/296 |
| 6,369,657 B1 | | 4/2002 | Dening et al. ............... 330/296 |
| 6,392,487 B1 | | 5/2002 | Alexanian .................... 330/254 |

(Continued)

FOREIGN PATENT DOCUMENTS

EP            0626765        11/1994

(Continued)

OTHER PUBLICATIONS

Motorola data sheet for MHW5342A 450 Mhz CATV Amplifier, 1994.*

(Continued)

*Primary Examiner*—Steven J. Mottola
(74) *Attorney, Agent, or Firm*—Withrow & Terranova, PLLC (57) ABSTRACT

The present invention provides temperature compensation for a power amplifier by varying a supply voltage applied to the power amplifier. The supply voltage is varied based on operating temperature in light of the temperature characteristics of the power amplifier. Thus, the variation in the supply voltage offsets variations in the characteristics of the power amplifier due to changes in temperature. Whether the power amplifier is used to control the output power of a transmitter or as part of a polar modulation system, temperature compensation of the power amplifier allows the power amplifier to provide an accurate and repeatable output signal having essentially no fluctuations due to changes in temperature.

23 Claims, 7 Drawing Sheets

U.S. PATENT DOCUMENTS

| | | | |
|---|---|---|---|
| 6,392,488 B1 | 5/2002 | Dupuis et al. | 330/277 |
| 6,404,287 B1 | 6/2002 | Dening et al. | 330/296 |
| 6,414,469 B1 | 7/2002 | Zhou et al. | 323/272 |
| 6,448,847 B1 | 9/2002 | Paul et al. | 327/563 |
| 6,462,620 B1 | 10/2002 | Dupuis et al. | 330/264 |
| 6,525,611 B1 | 2/2003 | Dening et al. | 330/298 |
| 6,528,983 B1 | 3/2003 | Augustine | 324/95 |
| 6,549,071 B1 | 4/2003 | Paul et al. | 330/252 |
| 6,566,963 B1 | 5/2003 | Yan et al. | 330/311 |
| RE38,140 E | 6/2003 | Schaffer | 363/65 |
| 6,624,702 B1 | 9/2003 | Dening | 330/297 |
| 6,658,265 B1 | 12/2003 | Steel et al. | 455/533.1 |
| 6,701,134 B1 | 3/2004 | Epperson | 455/102 |
| 6,701,138 B1 | 3/2004 | Epperson et al. | 455/127.3 |
| 6,720,831 B1 | 4/2004 | Dening et al. | 330/298 |
| 6,724,252 B1 | 4/2004 | Ngo et al. | 330/133 |
| 6,724,265 B1 | 4/2004 | Humphreys | 331/17 |
| 6,734,724 B1 | 5/2004 | Schell et al. | 330/10 |
| 2003/0054778 A1 | 3/2003 | Hecht | 455/115 |
| 2004/0072597 A1 | 4/2004 | Epperson et al. | 455/572 |
| 2004/0183511 A1 | 9/2004 | Dening | 323/282 |

FOREIGN PATENT DOCUMENTS

| | | |
|---|---|---|
| JP | 61095603 | 5/1986 |
| JP | 5235657 | 9/1993 |

OTHER PUBLICATIONS

Asbeck, P., et al., "Efficiency and Linearity Improvement in Power Amplifiers for Wireless Communications," University of California, San Diego, La Jolla, CA, IEEE 1998, pp. 15-18.

Hannington et al., "Microwave Power Amplifier Efficiency Improvement with a 10 MHz HBT DC—DC Converter," 1998 IEEE MTT-S International Microwave Symposium Digest, 1998.

International Search Report for related application PCT/US02/16636, mailed Dec. 2, 2003.

* cited by examiner

TEMPERATURE COMPENSATED POWER AMPLIFIER POWER CONTROL

FIELD OF THE INVENTION

The present invention relates to power amplifiers, and more specifically to compensating for variations in the characteristics of the power amplifier due to variations in temperature.

BACKGROUND OF THE INVENTION

There are several standards for mobile telephone communications. Each of these standards requires precise output power control over a large dynamic range. In order to provide output power control, mobile telephone architectures typically employ one or more power amplifiers that amplify a signal prior to transmission. However, the output of the power amplifier fluctuates due to variations in the characteristics of the power amplifier caused by changes in temperature. Thus, in order to provide precise output power control over a large dynamic range, some form of temperature compensation is desirable to compensate for variations in the output of the power amplifier due to variations in the characteristics of the power amplifier caused by changes in temperature.

Figure 1:
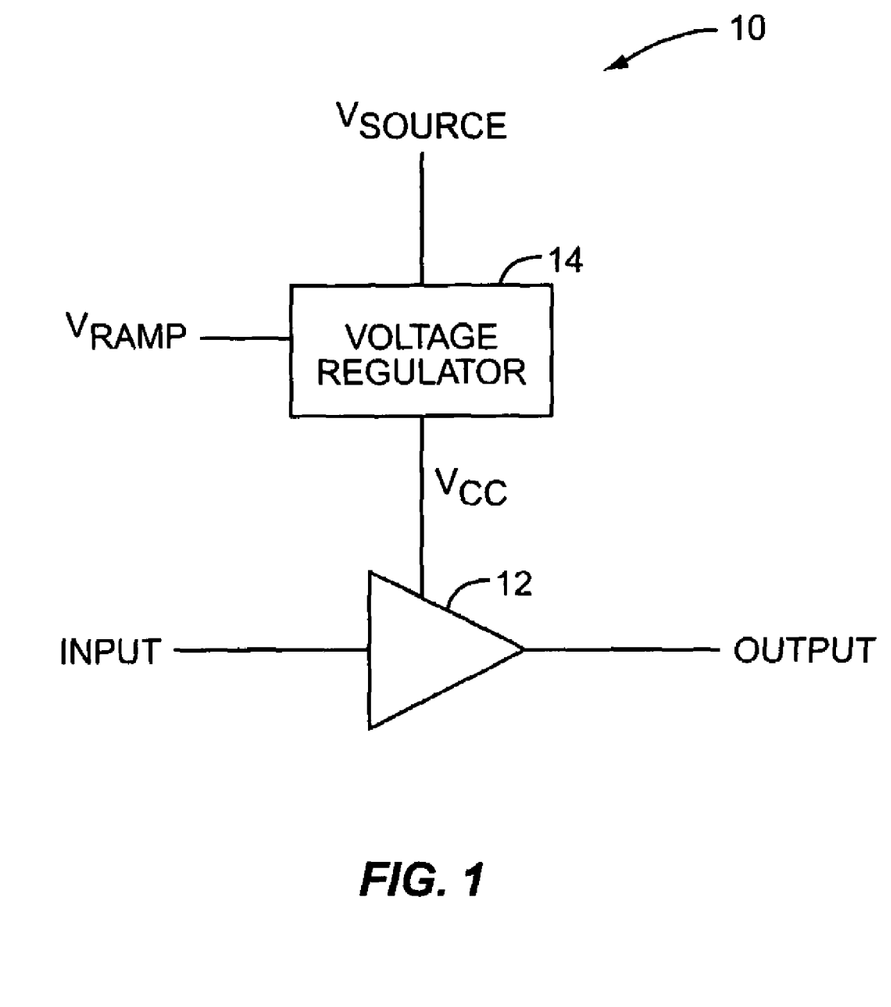
FIG. 1 illustrates a prior art system including a power amplifier and a voltage regulator.

The need for temperature compensation can be more clearly described with respect to FIG. 1. FIG. 1 illustrates a basic system 10 for controlling the output power of a mobile telephone having no temperature compensation. The system 10 includes a power amplifier 12 receiving a supply voltage ($V_{CC}$) from a voltage regulator 14. The voltage regulator 14 generates the supply voltage ($V_{CC}$) from a source voltage ($V_{SOURCE}$), such as a battery, based on a ramp voltage ($V_{RAMP}$). The system 10 may be part of a polar modulation system, wherein the ramp voltage ($V_{RAMP}$) is an amplitude signal corresponding to an amplitude component of data to be transmitted and the input signal (INPUT) is a carrier signal modulated by a phase component of the data to be transmitted. Based on the ramp voltage ($V_{RAMP}$), the power amplifier 12 modulates the input signal (INPUT) by the amplitude signal. However, since the system 10 does not provide temperature compensation for the power amplifier 12, changes in temperature cause the output of the power amplifier 12 to fluctuate, thereby introducing error into the output signal (OUTPUT) and degrading the performance of the polar modulation system.

The system 10 may also be used to control the output power of a transmitter. In this case, the ramp voltage ($V_{RAMP}$) is a control voltage that controls the output power of the power amplifier, thereby controlling the output power of the transmitter. However, since the system 10 does not provide temperature compensation for the power amplifier 12, changes in temperature result in fluctuations in the output power of the power amplifier.

Thus, there remains a need for a system that compensates for variations in the output power of a power amplifier due to temperature variations.

SUMMARY OF THE INVENTION

The present invention provides temperature compensation for a power amplifier by varying a supply voltage applied to the power amplifier. The supply voltage is varied based on operating temperature in light of the temperature characteristics of the power amplifier. Thus, the variation in the supply voltage offsets variations in the characteristics of the power amplifier due to changes in temperature. Whether the power amplifier is used to control the output power of a transmitter or as part of a polar modulation system, temperature compensation of the power amplifier allows the power amplifier to provide an accurate and repeatable output signal having essentially no fluctuations due to changes in temperature.

In one embodiment, the supply voltage is generated by circuitry including a voltage generator, which is preferably a bandgap voltage generator, an amplification circuit, and a voltage regulator. In this embodiment, the voltage generator generates a first voltage that varies with temperature in such a manner as to offset variations in the characteristics of the power amplifier due to changes in temperature. The amplification circuit amplifies the first voltage, thereby generating a reference voltage, and the voltage regulator generates the supply voltage based on the reference voltage and a control voltage. The overall effect of the circuitry is to generate the supply voltage that varies with temperature, thereby providing temperature compensation for the power amplifier.

The system of the present invention may be incorporated in a polar modulation system. In this embodiment, the control voltage used to generate the supply voltage represents an amplitude component of a polar modulation signal, and the input signal to the power amplifier is a radio frequency (RF) carrier signal modulated by a phase component of the polar modulation signal. Thus, the power amplifier modulates the input signal by the amplitude component of the polar modulation signal. According to the present invention, the output power of the power amplifier has essentially no fluctuations due to variations in temperature. Therefore, the present invention provides a system for performing polar modulation having essentially no error due to temperature variations.

The system of the present invention may also be incorporated in a transmitter of a mobile communication device for power control. In one embodiment, the control voltage is used to control the output power of the power amplifier, thereby controlling the output power of the mobile communication device. In another embodiment, the mobile communication device may have separate modes of operation. In one mode, the control voltage is the amplitude component of the polar modulation signal. In a second mode, the control voltage is a control signal used to control the output power of the power amplifier.

Those skilled in the art will appreciate the scope of the present invention and realize additional aspects thereof after reading the following detailed description of the preferred embodiments in association with the accompanying drawing figures.

BRIEF DESCRIPTION OF THE DRAWINGS FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 2A:
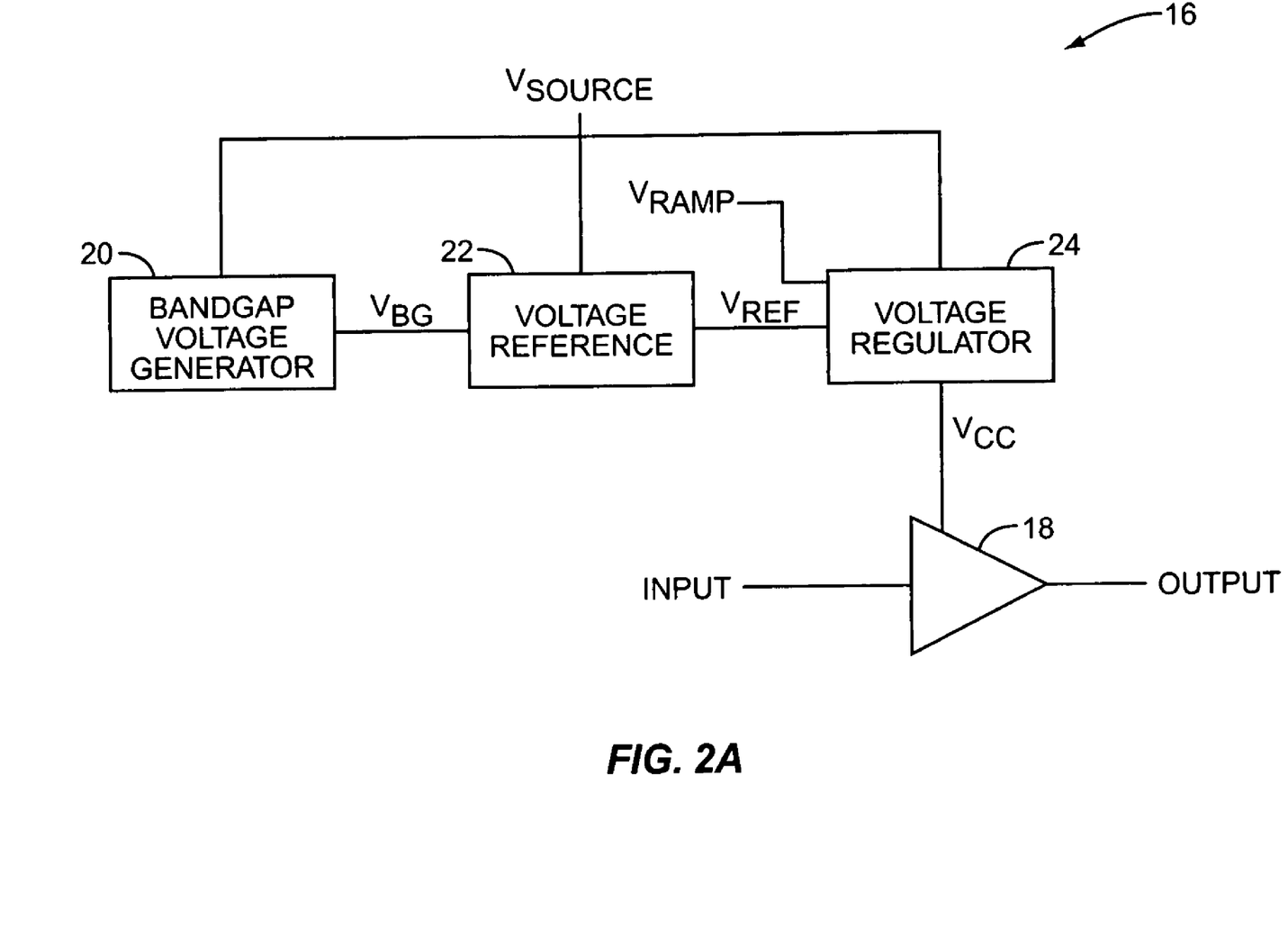
FIG. 2 illustrates a system that provides temperature compensation for a power amplifier according to one embodiment of the present invention.

FIG. 2A illustrates a system 16 providing temperature compensation for a power amplifier 18 according to one embodiment of the present invention. The power amplifier 18 amplifies an input signal (INPUT) and provides an accurate and repeatable output signal (OUTPUT) having essentially no fluctuations due to temperature variations. In general, the system 16 includes the power amplifier 18, a bandgap voltage generator 20, a voltage reference 22, and a voltage regulator 24. Variations in characteristics of the power amplifier 18 such as gain and saturation voltage due to temperature variations are compensated by variations in a bandgap voltage ($V_{BG}$) from the bandgap voltage generator 20. Based on the bandgap voltage ($V_{BG}$), the voltage reference 22 and the voltage regulator operate to generate a supply voltage ($V_{CC}$), which is provided to the power amplifier 18.

The power amplifier 18 operates to amplify the input signal (INPUT) to produce the output signal (OUTPUT). In order to provide temperature compensation for the power amplifier 18, the bandgap voltage generator 20 produces the bandgap voltage ($V_{BG}$) that is dependent on temperature in such a manner as to compensate for the variations in the characteristics of the power amplifier. The voltage reference 22 operates to amplify the bandgap voltage ($V_{BG}$), thereby generating a reference voltage ($V_{REF}$) that is sufficient for use by the voltage regulator 24. Based on the reference voltage ($V_{REF}$) and a ramp voltage ($V_{RAMP}$), the voltage regulator 24 generates the supply voltage ($V_{CC}$) from a voltage source ($V_{SOURCE}$), where the supply voltage ($V_{CC}$) is dependent on temperature and provides temperature compensation for the power amplifier 18.

The system 16 may be fabricated in numerous fashions. For example, system 16 may be integrated into a single module. Further, the bandgap voltage reference 20, the voltage reference 22, and the voltage generator may be fabricated using complementary metal oxide semiconductor (CMOS) technology and the power amplifier may be fabricated using gallium arsenide (GaAs). However, the system 16 may be fabricated using various materials and be arranged in separate modules or components without departing from the spirit or scope of the present invention.

Figure 2B:
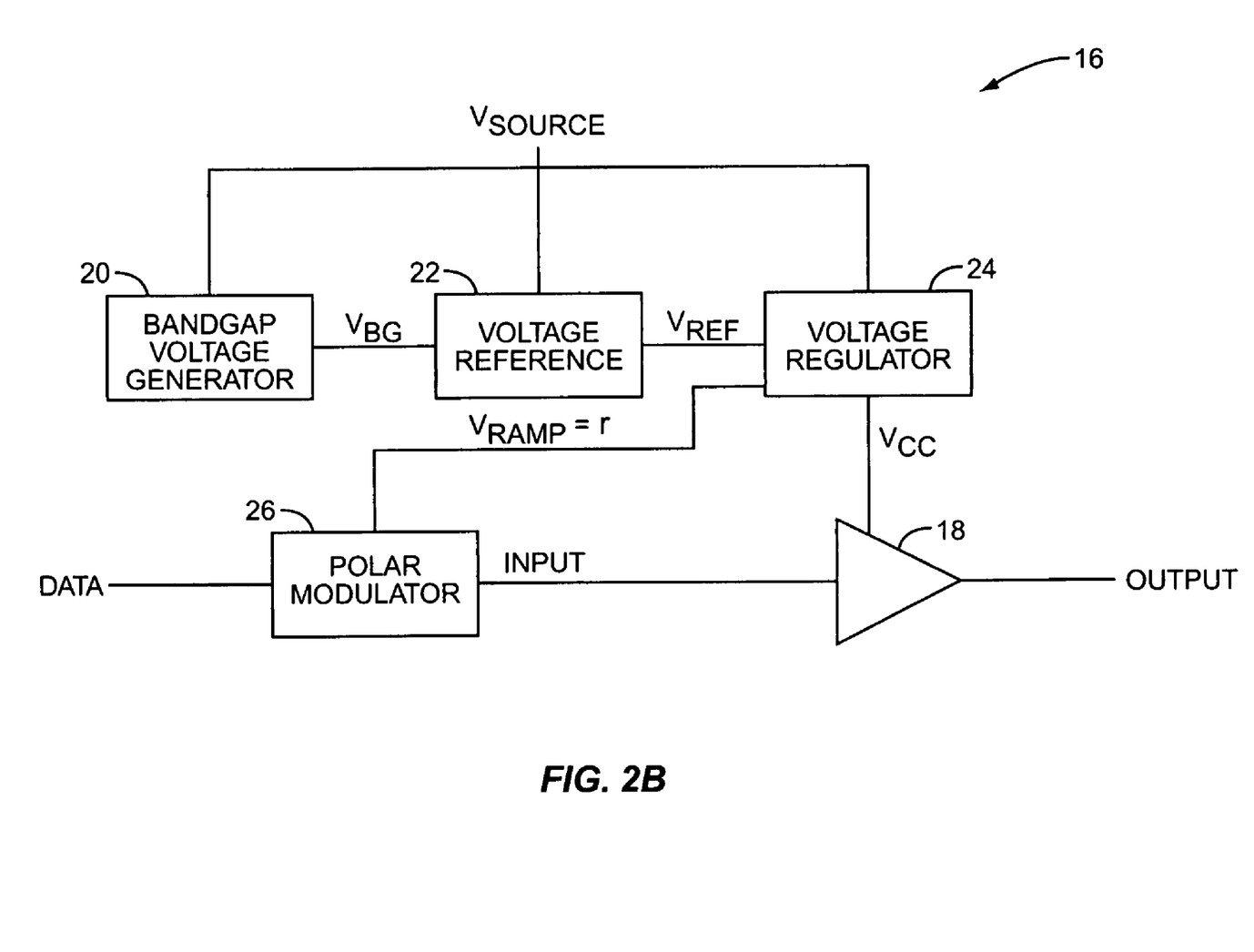

In one embodiment, the system 16 of the present invention is part of a polar modulation system, as illustrated in FIG. 2B, such as a mobile telephone. In this embodiment, polar modulation circuitry 26 performs polar modulation on data to be transmitted (DATA). Based on the data (DATA), the polar modulation circuitry 26 generates the input signal (INPUT), which is a radio frequency (RF) signal including a carrier frequency modulated by a phase component of the data to be transmitted (DATA). The polar modulation circuitry 26 also generates the ramp voltage ($V_{RAMP}$), which is an amplitude component (r) of the data to be transmitted. Based on the ramp voltage ($V_{RAMP}$), the voltage regulator 24 generates the supply voltage ($V_{CC}$) in such a manner as to modulate the input signal (INPUT) by the amplitude component (r) of the data to be transmitted (DATA). Typically, the variations in the characteristics of the power amplifier 18 due to temperature variations introduce error into the output signal (OUTPUT). However, the system 16 of the present invention provides temperature compensation for the power amplifier 18, thereby avoiding fluctuations in the output signal (OUTPUT) due to temperature variations and improving the performance of the polar modulation system.

Figure 2C:
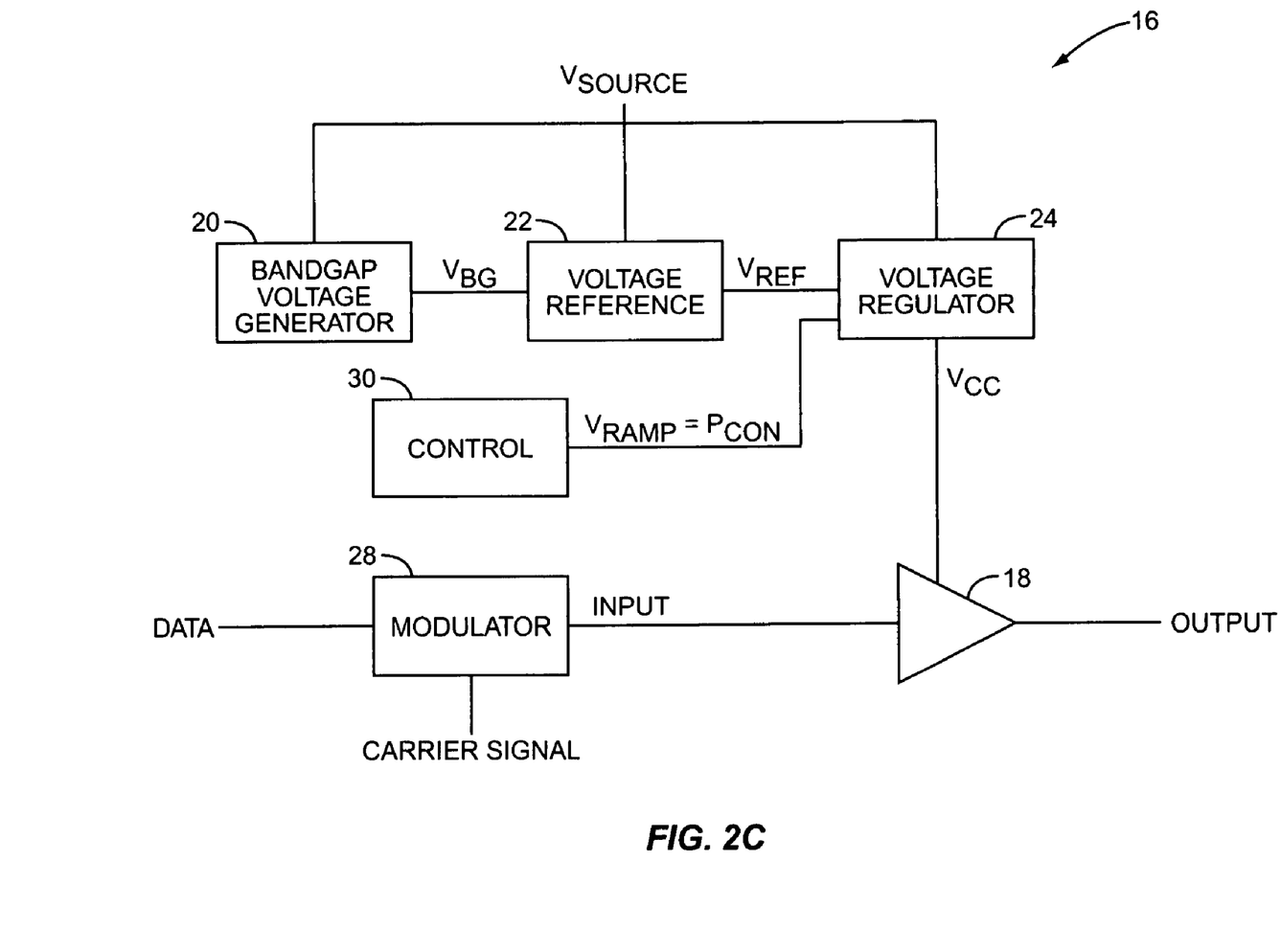

In another embodiment, the system 16 of the present invention is implemented in a mobile telephone (not shown) operating according to the Global System for Mobile Communications (GSM) or similar standard. As illustrated in FIG. 2C, in this embodiment, modulation circuitry 28 modulates a carrier signal by a data signal (DATA), thereby providing the input signal (INPUT). Typically, a control system 30 generates the ramp voltage ($V_{RAMP}$) to adjust the output power of the power amplifier 18, and thus the output power of the mobile telephone. It should also be recognized that the system 16 of the present invention may be implemented in a device such as a multimode mobile telephone, where the system 16 may be used for polar modulation or to control the output power of the device depending on the mode of operation.

Figure 3:
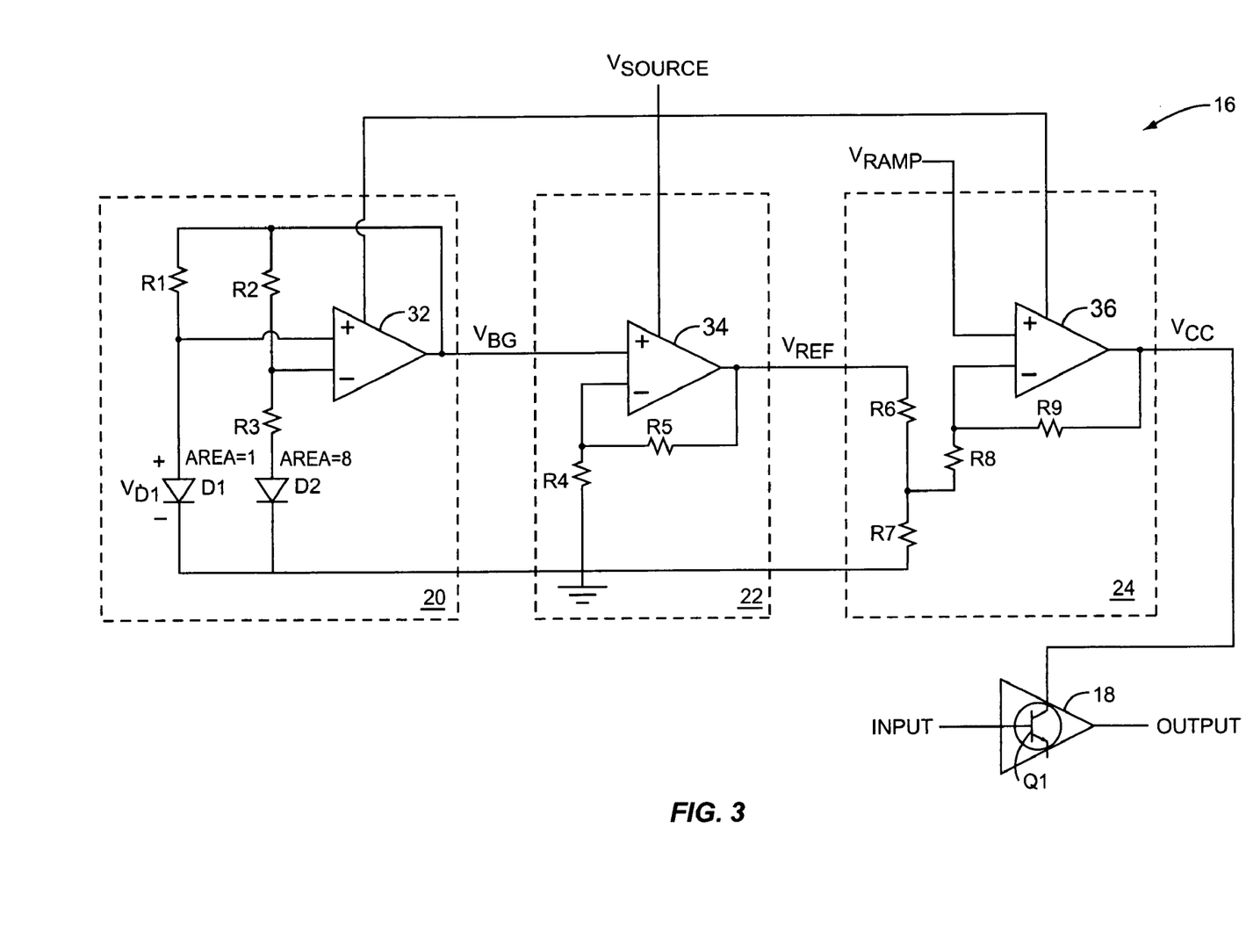
FIG. 3 is a more detailed illustration of the system of FIG. 2 according to one embodiment of the present invention.

FIG. 3 is a detailed illustration of one embodiment of the system 16 of the present invention. In this embodiment, the power amplifier 18 includes a transistor Q1 such as a heterojunction bipolar transistor (HBT). The power amplifier 18, including the transistor Q1, may be fabricated in various materials such as GaAs. When fabricated in GaAs, variations in temperature cause changes in the gain and saturation voltage of the transistor Q1 of the power amplifier 18.

As discussed above, the bandgap voltage generator 20 generates the bandgap voltage ($V_{BG}$) that is dependent on temperature. In this embodiment, the bandgap voltage generator 20 includes a first amplifier 32, resistors R1–R3, and diodes D1 and D2 arranged as shown. In one embodiment, the second diode D2 has an area that is eight times larger than the area of the first diode D1. Accordingly, the bandgap voltage ($V_{BG}$) is represented by the following equation:

$$V_{BG} = VD1 + \frac{R2}{R3} * .625E * 5 * \ln(8)(TEMP),$$

where VD1 is a voltage across the first diode D1, ln(8) is the natural log of the ratio of the area of the second diode D2 to the area of the first diode D1, and TEMP is temperature. Further, the voltage VD1 across the first diode D1 has a negative temperature coefficient, where the temperature coefficient defines the change in the voltage VD1 per change in temperature. The second and third resistors are selected such that the term (R2/R3)(8.625E−5)In(8)(TEMP), which is proportional to temperature, negates a portion of the change in the voltage VD1 due to temperature, thereby defining an overall temperature coefficient of the bandgap voltage generator 20 that offsets the variation of the characteristics of the power amplifier 18 due to variations in temperature. The overall temperature coefficient of the bandgap voltage generator 20 defines the change in the bandgap voltage ($V_{BG}$) per change in temperature.

The voltage reference 22 includes a second amplifier 34 and resistors R4 and R5 arranged as shown. The second amplifier 34 operates to produce the reference voltage ($V_{REF}$) based on amplifying the bandgap voltage ($V_{BG}$). Typically, the bandgap voltage ($V_{BG}$) is less than one or two volts. The voltage reference 22 amplifies the bandgap voltage ($V_{BG}$) to a level that is sufficient for use by the voltage regulator 24. As an example, the bandgap voltage ($V_{BG}$) may vary in a range from 0.8 to 1.2 volts and the second amplifier 22 may have a gain of approximately 3. Thus, the reference voltage ($V_{REF}$) varies in a range from 2.4 to 3.6 volts. In the illustrated embodiment, the gain of the second amplifier 34 is (R4+R5)/R4. However, the illustrated embodiment of the voltage reference 22 should be considered as exemplary rather than limiting.

The voltage regulator 24 includes a third amplifier 36 and resistors R6–R9 arranged as shown. The ramp voltage is connected to the non-inverting input (+) of the third amplifier 36. The inverting input (−) of the third amplifier 36 is coupled to the reference voltage ($V_{REF}$) through the resistors R6–R8, and to the supply voltage ($V_{CC}$) via the ninth resistor R9. Thus, the supply voltage ($V_{CC}$) is generated based on the ramp voltage ($V_{RAMP}$) and the reference voltage ($V_{REF}$). Further, since the reference voltage ($V_{REF}$) changes in response to variations in temperature, the supply voltage ($V_{CC}$) also changes in response to variations in temperature. The overall effect of the bandgap voltage generator 20, the voltage reference 22, and the voltage regulator 24 is to provide the supply voltage ($V_{CC}$) that varies in response to variations in temperature, thereby providing temperature compensation for the power amplifier 18. The embodiment of the voltage regulator 24 illustrated in FIG. 3 is for illustrative purposes only and should be considered as exemplary rather than limiting.

Figure 4A:
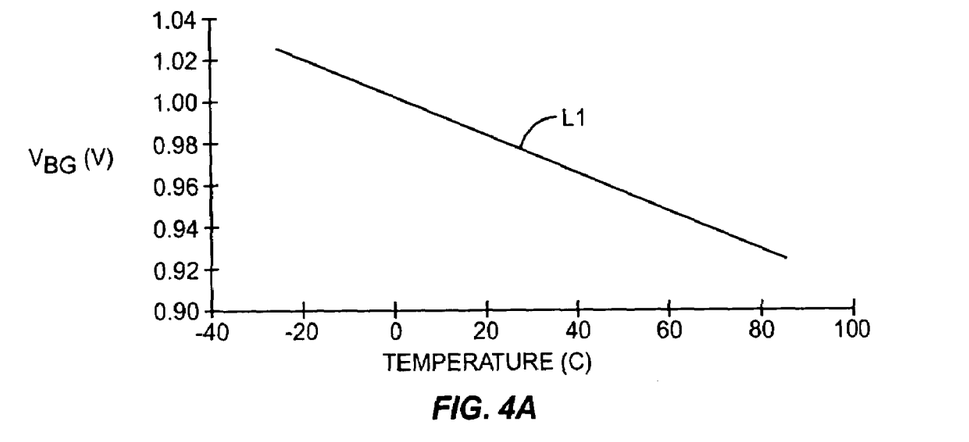
FIG. 4A illustrates the output of the bandgap voltage generator of the system of FIGS. 2 and 3 versus temperature according to one embodiment of the present invention.
Figure 4B:
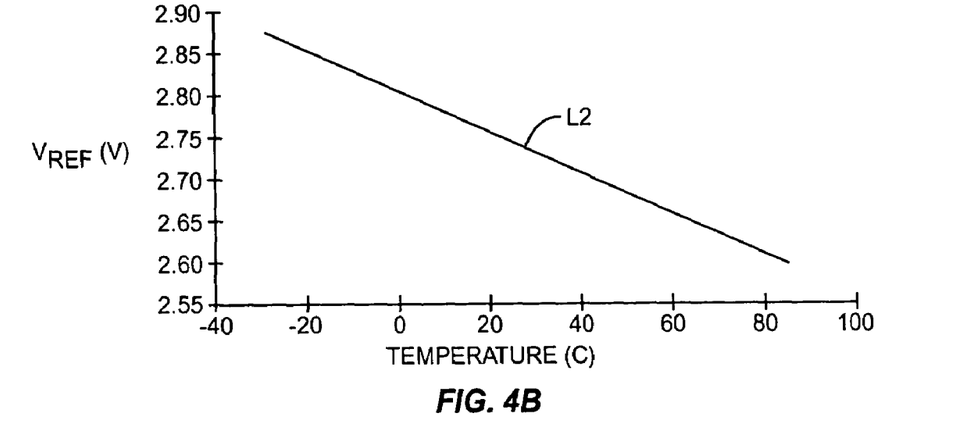
FIG. 4B illustrates the output of the voltage reference of the system of FIGS. 2 and 3 versus temperature according to one embodiment of the present invention.
Figure 4C:
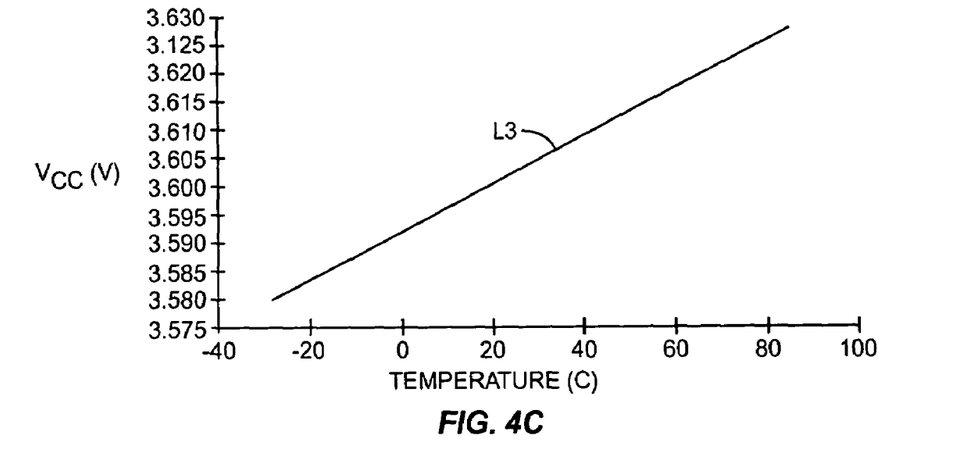
FIG. 4C illustrates the output of the voltage regulator of the system of FIGS. 2 and 3 versus temperature according to one embodiment of the present invention.

FIGS. 4A–4C illustrate the operation of the system 16 of FIGS. 2 and 3. Although specific ranges are shown for the bandgap voltage ($V_{BG}$), the reference voltage ($V_{REF}$), the supply voltage ($V_{CC}$), and temperature, these ranges should be considered exemplary rather than limiting. FIG. 4A is a graphical illustration of the bandgap voltage ($V_{BG}$) versus temperature according to one embodiment of the present invention. The overall temperature coefficient of the bandgap voltage generator 20 (FIGS. 2 and 3) is equivalent to the slope of line L1 illustrated in FIG. 4A. As discussed above, the overall temperature coefficient, and thus the slope, is determined by the ratio of the second resistor R2 (FIG. 3) to the third resistor R3 (FIG. 3). Further, the values of the resistors R2 and R3, and thus the overall temperature coefficient of the bandgap voltage generator 20, are selected such that the bandgap voltage ($V_{BG}$) and thus the supply voltage ($V_{CC}$) vary with temperature in such a manner as to offset the variations in the characteristics of the power amplifier 18 (FIGS. 2 and 3) due to temperature.

FIG. 4B graphically illustrates the relationship between the reference voltage ($V_{REF}$) and temperature. As discussed above, the reference voltage ($V_{REF}$) is generated based on amplifying the bandgap voltage ($V_{BG}$). Since the bandgap voltage ($V_{BG}$) varies with temperature, the reference voltage ($V_{REF}$) also varies with temperature. It should also be noted that the slope of line L2 is equivalent to the slope of the line L1 multiplied by the gain of the voltage reference 22 (FIGS. 2 and 3). The temperature coefficient of the voltage reference 22, which is defined as change in the reference voltage ($V_{REF}$) per change in temperature, is equivalent to the slope of the line illustrated in FIG. 4B. Thus, the temperature coefficient of the voltage reference 22 is equivalent to the temperature coefficient of the bandgap voltage generator 20 (FIGS. 2 and 3) multiplied by the gain of the voltage reference 22.

FIG. 4C graphically illustrates the relationship between the supply voltage ($V_{CC}$) and temperature when the ramp voltage ($V_{RAMP}$) is constant. As illustrated, the supply voltage ($V_{CC}$) increases as the temperature increases, thereby offsetting the variations in the characteristics of the power amplifier 18 (FIGS. 2 and 3) due to temperature. As discussed above, the temperature coefficient of the bandgap voltage generator 20 (FIGS. 2 and 3) is selected such that the bandgap voltage ($V_{BG}$) varies with temperature in such a manner as to cause the supply voltage ($V_{CC}$) to vary with temperature, thereby providing temperature compensation for the power amplifier 18 (FIGS. 2 and 3).

Figure 5A:
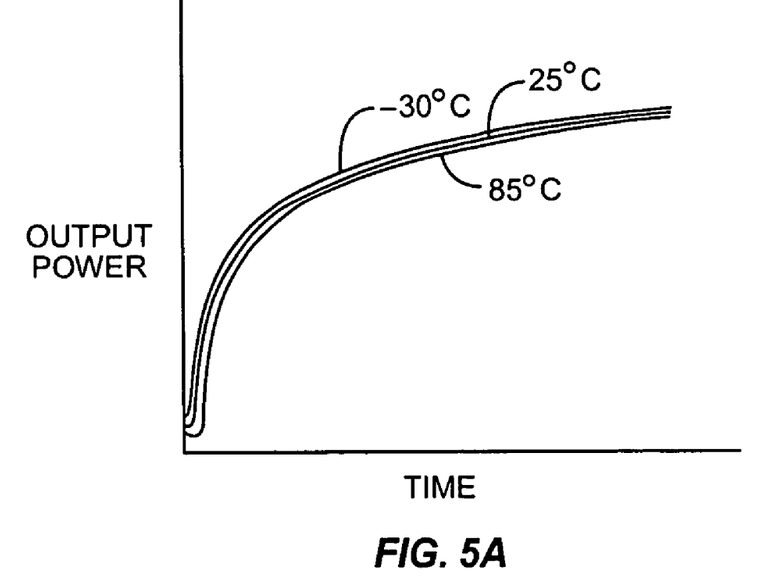
FIG. 5A illustrates the output power of the power amplifier of the system of FIG. 1.

FIG. 5A graphically illustrates the output power of the power amplifier 12 (FIG. 1) as the ramp voltage ($V_{RAMP}$) increases over time. The power amplifier 12 is not temperature compensated. As is shown, the output power of the power amplifier 12 without temperature compensation varies significantly as the temperature varies from −30 degrees Celsius to 85 degrees Celsius.

Figure 5B:
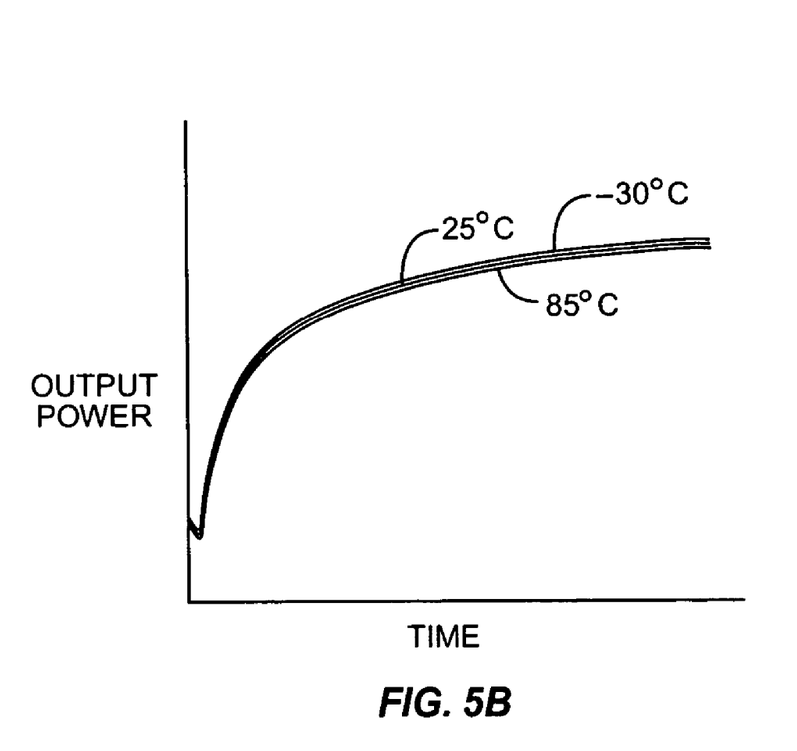
FIG. 5B illustrates the output power of the power amplifier of the system of FIGS. 2 and 3 according to one embodiment of the present invention.

FIG. 5B graphically illustrates the output power of the power amplifier 18 (FIGS. 2 and 3) that is temperature compensated according to the present invention. As with FIG. 5A, FIG. 5B illustrates the output power as the ramp voltage ($V_{RAMP}$) increases over time. As shown, the variation of the output power due to variations in temperature is essentially eliminated. Thus, the power amplifier 18 is compensated for variations in temperature and provides an accurate and repeatable output power having essentially no fluctuations due to temperature variations.

The system 16 of the present invention offers substantial opportunity for variation without departing from the spirit and scope of the invention. For example, embodiments of the voltage reference 22 and the voltage regulator 24 illustrated in FIG. 3 are meant to be exemplary rather than limiting. There are numerous other circuits that may be used to implement the voltage reference 22 and the voltage regulator 24. As another example, although the embodiment of the bandgap voltage generator 20 illustrated in FIG. 3 is the preferred embodiment of the bandgap voltage generator 20, numerous circuits may be used to generate a voltage that varies with temperature.

Those skilled in the art will recognize improvements and modifications to the preferred embodiments of the present invention. All such improvements and modifications are considered within the scope of the concepts disclosed herein and the claims that follow.

What is claimed is:

1. A system for compensating a power amplifier for variations due to temperature comprising:
   a power amplifier adapted to amplify an input signal based on a supply voltage, thereby producing an output signal;
   a voltage generator adapted to generate a first voltage based on temperature such that the first voltage varies with temperature in such a manner as to offset variations in characteristics of the power amplifier due to variations in temperature;

amplification circuitry adapted to amplify the first voltage to provide a reference voltage; and a voltage regulator adapted to provide the supply voltage based on the reference voltage and a control signal such that a change in temperature results in a change in the supply voltage, wherein the change in the supply voltage offsets variations in characteristics of the power amplifier due to variations in temperature.

2. The system of claim 1 wherein the output power of the power amplifier has essentially no variation due to temperature variation over a defined temperature range.

3. The system of claim 1 wherein the voltage generator is a bandgap voltage generator.

4. The system of claim 1 wherein the voltage generator comprises at least one resistor having a resistance value that determines an overall temperature coefficient of the voltage generator.

5. A system for compensating a power amplifier for variations due to temperature comprising:
a power amplifier adapted to amplify an input signal based on a supply voltage, thereby producing an output signal; and
circuitry adapted to generate the supply voltage based on a control signal and temperature such that a change in temperature results in a change in the supply voltage, wherein the change in the supply voltage offsets variations in characteristics of the power amplifier due to variations in temperature;
wherein the control signal is an amplitude component of data to be transmitted such that the power amplifier modulates the input signal by the amplitude component of the data to be transmitted.

6. The system of claim 5 wherein the input signal provided to the power amplifier includes a radio frequency (RF) carrier signal modulated by a phase component of data to be transmitted.

7. The system of claim 1 wherein the control signal is a power control signal.

8. A system for compensating a power amplifier for variations due to temperature comprising:
a power amplifier adapted to amplify an input signal based on a supply voltage, thereby producing an output signal; and
circuitry adapted to generate the supply voltage based on a control signal and temperature such that a change in temperature results in a change in the supply voltage, wherein the change in the supply voltage offsets variations in characteristics of the power amplifier due to variations in temperature;
wherein the power amplifier is fabricated in Gallium Arsenide (GaAs), the circuitry is fabricated using Complementary Metal Oxide Semiconductor (CMOS) technology, and the power amplifier and the circuitry are integrated into a single module.

9. A method for compensating a power amplifier for variations due to temperature comprising:
generating a first voltage based on temperature such that the first voltage varies with temperature in such a manner as to offset variations in the characteristics of the power amplifier due to variations in temperature;
amplifying the first voltage to provide a reference voltage;
generating a supply voltage from a source voltage based on the reference voltage and the control signal such that a change in temperature results in a change in the supply voltage, wherein the change in the supply voltage offsets variations in characteristics of the power amplifier due to variations in temperature; and
amplifying an input signal based on the supply voltage, thereby providing an output signal having essentially no variation due to temperature variation over a defined temperature range.

10. The method of claim 9 wherein an overall temperature coefficient of the generating the first voltage step is determined based on at least one resistor.

11. A method for compensating a power amplifier for variations due to temperature comprising:
generating a supply voltage based on a control signal and temperature such that a change in temperature results in a change in the supply voltage, wherein the change in the supply voltage offsets variations in characteristics of the power amplifier due to variations in temperature; and
amplifying an input signal based on the supply voltage, thereby providing an output signal having essentially no variation due to temperature variation over a defined temperature range;
wherein the control signal is an amplitude component of data to be transmitted such that the amplifying the input signal step modulates the input signal by the amplitude component of the data to be transmitted.

12. The method of claim 11 wherein the input signal provided to the power amplifier includes a radio frequency (RF) carrier signal modulated by a phase component of data to be transmitted.

13. The method of claim 9 wherein the control signal is a power control signal that controls the gain of the amplifying the input signal step.

14. A system for compensating a power amplifier for variations due to temperature comprising:
a power amplifier adapted to amplify an input signal based on the supply voltage, thereby producing an output signal, the input signal including a radio frequency (RF) carrier signal modulated by a phase component of a polar modulation signal;
a voltage generator adapted to generate a first voltage based on temperature such that the first voltage varies with temperature in such a manner as to offset variations in the power amplifier due to variations in temperature;
amplification circuitry adapted to amplify the first voltage to provide a reference voltage; and
a voltage regulator adapted to provide the supply voltage based on the reference voltage and an amplitude component the polar modulation signal such that the power amplifier modulates the input signal by the amplitude component of the polar modulation signal.

15. The system of claim 14 wherein the output power of the power amplifier has essentially no variation due to temperature variation over a defined temperature range.

16. The system of claim 14 wherein the voltage generator comprises at least one resistor having a resistance value that determines an overall temperature coefficient of the voltage generator.

17. The system of claim 14 wherein the power amplifier is fabricated in Gallium Arsenide (GaAs).

18. The system of claim 17 wherein the voltage generator, the amplification circuitry, and the voltage regulator are fabricated using Complementary Metal Oxide Semiconductor (CMOS) technology and integrated with the power amplifier in a single module.

19. A system for compensating a power amplifier for variations due to temperature comprising:
- a power amplifier adapted to amplify an input signal based on a supply voltage, and produce an output signal;
- a bandgap voltage generator adapted to generate a first voltage based on temperature such that the first voltage varies with temperature in such a manner as to offset variations in the power amplifier due to variations in temperature;
- amplification circuitry adapted to amplify the first voltage to provide a reference voltage; and
- a voltage regulator adapted to provide the supply voltage based on the reference voltage and a control signal such that a change in temperature results in a change in the supply voltage.

20. The system of claim 19 wherein the output power of the power amplifier has essentially no variation due to temperature variation over a defined temperature range.

21. The system of claim 19 wherein the control signal is an amplitude component of data to be transmitted such that the power amplifier modulates the input signal by the amplitude component of the data to be transmitted.

22. The system of claim 21 wherein the input signal provided to the power amplifier includes a radio frequency (RF) carrier signal modulated by a phase component of data to be transmitted.

23. The system of claim 19 wherein the control signal is a power control signal.

* * * * *